(12) United States Patent
Lee et al.

(10) Patent No.: US 11,133,179 B2
(45) Date of Patent: Sep. 28, 2021

(54) THIN-FILM STRUCTURE AND METHOD OF MANUFACTURING THE SAME

(71) Applicants: Samsung Electronics Co., Ltd., Suwon-si (KR); Cornell University, Ithaca, NY (US)

(72) Inventors: Kiyoung Lee, Seoul (KR); Woojin Lee, Suwon-si (KR); Myoungho Jeong, Seongnam-si (KR); Yongsung Kim, Suwon-si (KR); Eunsun Kim, Suwon-si (KR); Hyosik Mun, Hwaseong-si (KR); Jooho Lee, Hwaseong-si (KR); Changseung Lee, Yongin-si (KR); Kyuho Cho, Seoul (KR); Darrell G. Schlom, Ithaca, NY (US); Craig J. Fennie, Ithaca, NY (US); Natalie M. Dawley, Ithaca, NY (US); Gerhard H. Olsen, Ithaca, NY (US); Zhe Wang, Ithaca, NY (US)

(73) Assignees: Samsung Electronics Co., Ltd., Gyeonggi-do (KR); Cornell University, Ithaca, NY (US)

(*) Notice: Subject to any disclaimer, the term of this patent is extended or adjusted under 35 U.S.C. 154(b) by 6 days.

(21) Appl. No.: 16/697,774

(22) Filed: Nov. 27, 2019

(65) Prior Publication Data

US 2021/0159072 A1 May 27, 2021

(51) Int. Cl.
*H01L 49/02* (2006.01)
*H01L 21/02* (2006.01)

(52) U.S. Cl.
CPC .. *H01L 21/02194* (2013.01); *H01L 21/02192* (2013.01); *H01L 21/02197* (2013.01); *H01L 28/56* (2013.01); *H01L 28/65* (2013.01)

(58) Field of Classification Search
CPC . H01L 27/1248; H01L 29/7843; H01L 28/55; H01L 49/02
See application file for complete search history.

(56) References Cited

U.S. PATENT DOCUMENTS

| | | | |
|---|---|---|---|
| 5,760,432 A | 6/1998 | Abe et al. | |
| 6,844,661 B2 | 1/2005 | Mizuno | |

(Continued)

FOREIGN PATENT DOCUMENTS

| | | |
|---|---|---|
| CN | 102951902 A | 3/2013 |
| JP | 2007-19504 A | 1/2007 |

OTHER PUBLICATIONS

J. Haeni et al. 'Epitaxial growth of the first five members of the Sr n+1 Ti n O 3n+1 Ruddlesden-Popper homologous series' *Applied Physics Letters*, vol. 78 No. 21, May 2001.

(Continued)

*Primary Examiner* — Jae Lee
(74) *Attorney, Agent, or Firm* — Harness, Dickey & Pierce, P.L.C.

(57) ABSTRACT

A thin-film structure includes a support layer and a dielectric layer on the support layer. The support layer includes a material having a lattice constant. The dielectric layer includes a compound having a Ruddlesden-Popper phase $(A_{n+1}B_nX_{3n+1})$. where A and B each independently include a cation, X is an anion, and n is a natural number. The lattice constant of the material of the support layer may be less than a lattice constant of the compound.

20 Claims, 9 Drawing Sheets

(56) References Cited

U.S. PATENT DOCUMENTS

| 7,635,900 | B2 | 12/2009 | Shimizu et al. |
| 9,947,469 | B2 | 4/2018 | Furukawa et al. |
| 2005/0040481 | A1* | 2/2005 | Shimizu ............ H01L 21/02244 257/411 |
| 2017/0137966 | A1* | 5/2017 | Kiyama ................ C30B 29/406 |
| 2018/0040711 | A1* | 2/2018 | Rondinelli .............. H01L 29/24 |

OTHER PUBLICATIONS

H. Lee et al. 'Exploiting dimensionality and defect mitigation to create tunable microwave dielectrics' *Nature*, vol. 502, Oct. 2013.
J. Haeni et al. 'Room-temperature ferroelecticity in strained SrTiO3' *Nature Publishing Group*, vol. 430, Aug. 2004.

\* cited by examiner

THIN-FILM STRUCTURE AND METHOD OF MANUFACTURING THE SAME

BACKGROUND

1. Field

The present disclosure is directed to a method of embodying a dielectric material having high permittivity.

2. Description of Related Art

In recent years, along with the miniaturization and manufacture of high performance of electronic devices, there has been a demand for miniaturization and high performance of electronic devices employed in various electronic circuits. Such electronic circuits include a plurality of metal insulator metal (MIM) capacitors and metal oxide semiconductor (MOS) transistors. To realize miniaturization, large capacity and high performance for MIM and MOS, there is a need to develop dielectric materials having high permittivity, and low leakage current characteristics even at a small thickness.

SUMMARY

Provided is a thin-film structure including a dielectric material having high permittivity.

Provided is an electronic device including the thin-film structure.

Provided is a method of manufacturing the thin-film structure.

Additional aspects will be set forth in part in the description which follows and, in part, will be apparent from the description, or may be learned by practice of the presented embodiments of the disclosure.

According to an aspect of the present disclosure, a thin-film structure includes a support layer including a material having a lattice constant and a dielectric layer on the support layer. The dielectric layer may include a compound having a Ruddlesden-Popper phase $(A_{n+1}B_nX_{3n+1})$, where A and B each independently include a cation, X is an anion, and n is a natural number, the lattice constant of the material of the support layer being less than a lattice constant of the compound.

In some embodiments, A may be an alkali metal, an alkaline earth metal, or a rare earth metal, and B may be a transition metal.

In some embodiments, a compressive strain may occur in the dielectric layer at an interface between the dielectric layer and the supporting layer. The compressive strain in the dielectric layer may occur in an in-plane direction that is in-plane with the interface between the dielectric layer and the supporting layer. The compressive strain in the dielectric layer may induce a tensile strain in the dielectric layer, and the tensile strain occur in an out-of-plane direction that is out-of-plane with the interface between the dielectric layer and the supporting layer.

In some embodiments, the tensile strain in the dielectric layer that occurs in the out-of-plane direction may vary with the n value of the compound and the lattice constant of the material of the support layer.

In some embodiments, the lattice constant of the material included in the support layer may be capable of maximizing the tensile strain in the dielectric layer that occurs in the out-of-plane direction with respect to the compound.

In some embodiments, the material in the support layer may include a compound having a perovskite structure.

In some embodiments, A may include strontium (Sr) and barium (Ba) at a desired (and/or alternatively predetermined) ratio.

In some embodiments, the compound may be represented by $(Sr, Ba)_{n+1}Ti_nO_{3n+1}$.

In some embodiments, the compound may be represented by $(SrTiO_3)_{n-1}(BaTiO_3)_1SrO$.

In some embodiments, a unit cell of the compound may include a perovskite layer represented by $(Sr, Ba)TiO_3$ and a rocksalt layer represented by SrO, and a ratio of Sr and Ba may be determined such that Ba is not adjacent to the rocksalt layer.

According to an aspect of the present disclosure, a thin-film structure includes a lower electrode layer including a conductive compound having a perovskite structure; and a dielectric layer on the lower electrode layer. The dielectric layer may include a compound with a lattice constant that is greater than the lattice constant of the conductive compound. The compound may have a Ruddlesden-Popper phase $(A_{n+1}B_nX_{3n+1})$(A and B may each independently include a cation, X may be an anion, and n may be a natural number).

In some embodiments, A may be an alkali metal, an alkaline earth metal, or a rare earth metal; and B may be a transition metal.

In some embodiments, a compressive strain may occur in the dielectric layer at an interface between the dielectric layer and the lower electrode layer. The compressive strain in the dielectric layer may occur in an in-plane direction that is in-plane with the interface between the dielectric layer and the lower electrode layer. The compressive strain in the dielectric layer may induce a tensile strain in the dielectric layer, and the tensile strain occur in an out-of-plane direction that is out-of-plane with the interface between the dielectric layer and the lower electrode layer.

In some embodiments, the tensile strain in the dielectric layer that occurs in the out-of-plane direction may vary with the n value of the compound and the lattice constant of the material of the support layer.

In some embodiments, A may include two or more kinds of elements used together at a desired (and/or alternatively predetermined) ratio.

In some embodiments, A may include strontium (Sr) and barium (Ba) at a desired (and/or alternatively predetermined) ratio.

In some embodiments, the compound may be represented by $(Sr, Ba)_{n+1}Ti_nO_{3n+1}$.

In some embodiments, the compound may be represented by $(SrTiO_3)_{n-1}(BaTiO_3)_1SrO$.

In some embodiments, a unit cell of the compound may include a perovskite layer represented by $(Sr, Ba)TiO_3$ and a rocksalt layer represented by SrO, and a ratio of Sr and Ba may be determined such that Ba is not adjacent to the rocksalt layer.

In some embodiments, the lattice constant of the material included in the support layer may be capable of maximizing the tensile strain in the dielectric layer that occurs in the out-of-plane direction with respect to the compound.

In some embodiments, the material in the support layer may include a compound having a perovskite structure.

In some embodiments, A includes strontium (Sr) and barium (Ba) at a desired (and/or alternatively predetermined) ratio.

In some embodiments, the thin-film structure may further include a silicon substrate and a buffer layer, and the buffer layer, the lower electrode layer, and the dielectric layer may be sequentially located on the silicon substrate.

In some embodiments, the buffer layer may include a material having a perovskite structure.

In some embodiments, the lower electrode layer may include $SrRuO_3$, and the buffer layer may include $SrTiO_3$.

In some embodiments, an aspect of the present disclosure provides an integrated device including: the thin-film structure described above, and an upper electrode layer on the lower electrode layer to face the lower electrode layer with the dielectric layer therebetween on the thin-film structure.

According to example embodiments, a thin-film structure includes a support layer including a material having a lattice constant and a dielectric layer on the support layer. The dielectric layer may include a compound having a lattice constant that is greater than the lattice constant of the material in the support layer such that compressive strain occurs in the dielectric layer in an in-plane direction that is in-plane with an interface between the dielectric layer and the support layer. The compound of the dielectric layer may have a Ruddlesden-Popper phase ($A_{n+1}B_nX_{3n+1}$), where A includes two or more elements selected from the group consisting of alkali metals, alkaline earth metals, and rare earth metals; B is a transition metal, X is an anion, and n is a natural number.

In some embodiments, A may include strontium (Sr) and barium (Ba) at a ratio to each other, B may be titanium (Ti), and X may be oxygen (O).

In some embodiments, a unit cell of the compound may include a perovskite layer represented by $(Sr, Ba)TiO_3$ and a rocksalt layer represented by SrO. A ratio of Sr and Ba may be determined such that Ba is not adjacent to the rocksalt layer. The compressive strain in the dielectric layer may induce a tensile strain in the dielectric layer, and the tensile strain may occur in an out-of-plane direction that is out-of-plane with the interface between the dielectric layer and the supporting layer.

In some embodiments, an upper electrode on the dielectric layer of the above-described thin-film structure. The support layer may include a lower electrode layer.

In some embodiments, an electronic device may include the capacitor.

An aspect of the present disclosure provides a method of manufacturing a thin-film structure, the method may include forming a dielectric layer on a substrate. The substrate may include a material having a lattice constant. The dielectric layer may include a compound having a Ruddlesden-Popper phase ($A_{n+1}B_nX_{3n+1}$), where A and B each independently include a cation, X is an anion, and n is a natural number, and the lattice constant of the material of the substrate may be less than a lattice constant of the compound of the dielectric layer.

In some embodiments, the forming the dielectric layer may include determining A, B, X, and n based on analyzing a trend of an angular frequency of an in-plane motion and an out-of-plane motion of phonons according to a strain in a direction of the out-of-plane at an interface between the substrate and the dielectric layer.

In some embodiments, the forming the dielectric layer on the substrate may include growing the dielectric layer using a growth method that maintains a crystallinity of the compound of the dielectric layer.

In some embodiments, the forming the dielectric layer may include growing a plurality of atomic layers constituting the compound in units of atomic layers.

In some embodiments, the forming the dielectric layer may be performed using chemical vapor deposition (CVD), molecular beam epitaxy (MBE), or pulsed laser deposition (PLD).

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings. In the following drawings, like reference numerals refer to like elements, and the size of each element in the drawings may be exaggerated for clarity and convenience of explanation. Meanwhile, the embodiments described below are merely illustrative, and various other modifications can be made from these embodiments.

Hereinafter, when a first element is described as being "above" or "on" a second element, embodiments using these expressions may include the case in which the first element may be directly on the second element and the case in which the first element is located above the second element while the first and second elements do not contact each other.

As used herein, the singular forms "a", "an", and "the" are intended to include the plural forms as well, unless the context clearly indicates otherwise. When a portion "includes" an element, unless otherwise described, another element may be further included, rather than the presence of other elements being excluded.

Also, terms such as "portion," "module," etc. used herein indicate a unit for processing at least one function or operation, in which the unit and the block may be embodied as hardware or software or may be embodied by a combination of hardware and software.

Figure 1:
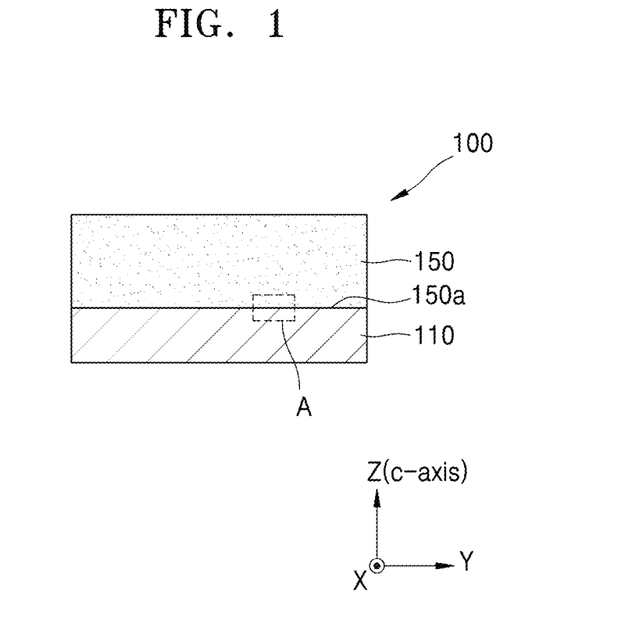
FIG. 1 shows a schematic view of a thin-film structure according to an embodiment.
Figure 2:
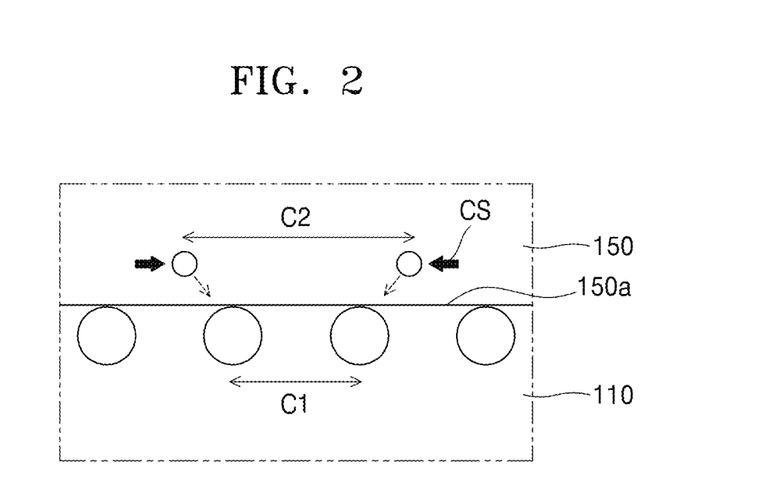
FIG. 2 shows a conceptual diagram for explaining the interfacial strain of the thin-film structure of FIG. 1.

FIG. 1 shows a cross-sectional view showing a schematic structure of a thin-film structure 100 according to an embodiment. FIG. 2 shows a conceptual diagram for explaining interfacial strain of the thin-film structure of FIG. 1, and is an enlarged view of portion A of FIG. 1.

The thin-film structure 100 includes a support layer 110 and a dielectric layer 150 formed on the support layer 110. In the thin-film structure 100, there is an interface 150a between the support layer 110 and the dielectric layer 150. The interfacial strain between the support layer 110 and the dielectric layer 150 is controlled to allow the dielectric layer 150 to have a high level of permittivity. Each of the support layer 110 and the dielectric layer 150 has a crystal structure, and the lattice constant of the support layer 110 is smaller than the lattice constant of the dielectric layer 150. When an electric field is applied to a dielectric material, a dielectric polarization phenomenon occurs in which polar molecules are aligned.

The degree of polarization is proportional to the electric field. The extent at which the degree of the dielectric polarization is proportional to the applied electric field may be expressed as permittivity. In general, the permittivity ($\varepsilon$) of dielectric material may be expressed as a relative permittivity ($\varepsilon_r$), which is a ratio with respect to the permittivity ($\varepsilon_0$) of vacuum, and the relative permittivity may also be called a dielectric constant. Since permittivity to be used below does not deal with absolute values, these expressions may be used together.

On the other hand, due to the molecular structure of the dielectric material, the extent at which the degree of the dielectric polarization is proportional to the applied electric field may vary depending on the direction of the applied electric field. Since the dielectric layer 150 according to an embodiment has a crystal structure, the permittivity of the c-axis direction (Z direction in the drawing) is different from the permittivity of a plane perpendicular thereto (in-plane, an x-y plane in the drawing).

The permittivity of particular interest in embodiments is the permittivity in the direction of out-of-plane. This is because in an electronic device including the thin-film structure 100, an electric field is applied in the direction of out-of-plane and thus, the resulting behavior of the dielectric layer 150 may be a major performance factor. To increase the permittivity of the dielectric layer 150 in the direction of out-of-plane, materials for the support layer 110 and the dielectric layer 150 are determined such that, in the dielectric layer 150, the compressive strain in the dielectric layer 150 induces tensile strain in the direction of out-of-plane, and polarization in the direction of out-of-plane is generated.

As illustrated in FIG. 2, the support layer 110 may have a crystal structure having a lattice constant C1 and the dielectric layer 150 may have a crystal structure having a lattice constant C2. The lattice constant C2 of the dielectric layer 150 is greater than the lattice constant C1 of the support layer 110. Accordingly, when the dielectric layer 150 is epitaxially grown on the support layer 110, a strain may occur due to a lattice mismatch. The atoms forming the crystal structure of the dielectric layer 150 are forced to be closer between adjacent atoms due to a small lattice constant of the support layer 110, and in-plane compressive strain CS may occur on an interfacial surface between the dielectric layer 150 and the support layer 110 or a region adjacent thereto. A material that constitutes the dielectric layer 150 may include a plurality of atomic layers, and the compressive strain CS in the direction of in-plane illustrated in FIG. 2 is gradually rotated in each atomic layer toward the direction of out-of-plane, ultimately inducing tensile strain in the direction of out-of-plane inside the dielectric layer 150.

A model which treats the quantized vibrations of the crystal lattice as phonon motion can be used for the analysis of various properties of solids. By analyzing the motion of the phonon, the relationship between the applied tensile strain and permittivity may be derived. In the thin-film structure 100 according to embodiments, the detailed structure of the compound that constitutes the dielectric layer 150 may be determined in such a way that the out-of-plane tensile strain acting on the dielectric layer 150 derives a high level of permittivity in the direction of out-of-plane.

The dielectric layer 150 may include a compound having Ruddlesden-Popper phase $(A_{n+1}B_nX_{3n+1})$(A and B are each a cation, X is an anion, and n is a natural number)(hereinafter referred to as 'RP phase'). A may be an alkali metal, an alkaline earth metal, or a rare earth metal. B may be a transition metal. In some embodiments, A may include only one kind of atoms. In other embodiments, A may include two or more kinds of atoms mixed at a certain ratio. The ratio of two or more kinds of atoms may be set in such a manner that the out-of-plane tensile strain effectively results in out-of-plane permittivity. For example, the ratio of two or more kinds of atoms used as A may be set to obtain an optimal atomic arrangement for achieving high out-of-plane permittivity in the crystal structure of the RP phase compound. For example, a RP phase compound is expressed as a combination structure of e-compound perovskite layer ($ABO_3$) and a rocksalt layer (AO). In this regard, the ratio of atoms constituting A may be set to obtain the optimal out-of-plane tensile strain according to the relative atomic arrangement of the perovskite layer and the rocksalt layer, leading to high out-of-plane permittivity. For use as A, Sr and Ba may be used together at a certain ratio, but embodiments are not limited thereto.

The RP phase compound may include a (Ba, Sr) $TiO_3$ structure. (Ba, Sr) represents $Ba_jSr_k$(j+k=1, 0≤j, and k≤1). $SrTiO_3$ is known to have ferroelectric properties under strains. That is, the paraelectric property of $SrTiO_3$ is changed into the ferroelectric property due to strains.

Figure 3:
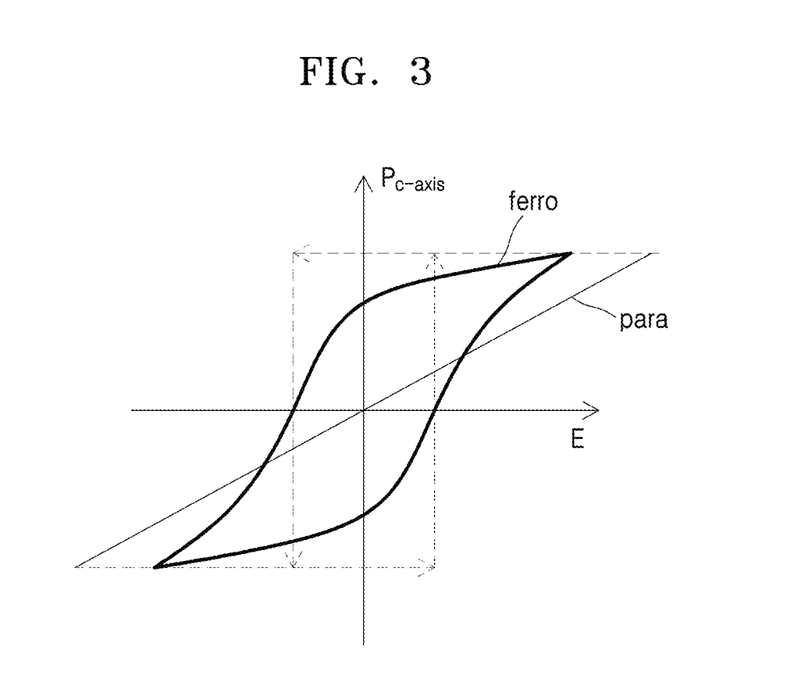
FIG. 3 shows a conceptual hysteresis graph for explaining ferroelectricity.

FIG. 3 shows a conceptual hysteresis graph illustrating ferroelectric properties. Permittivity is related to the rate at which a dielectric polarization occurs in the direction of the applied electric field (E). The illustrated graph is of dielectric polarization phenomenon ($P_{c-axis}$) in the direction of out-of-plane with respect to the electric field in the direction of out-of-plane, and the slope of the graph is associated with the permittivity in the direction of out-of-plane. A material showing a paraelectric property experiences dielectric polarization along the line indicated as para in proportion to the electric field (E). In the case of the ferroelectric property, once the dielectric polarization is formed by the applied electric field (E), even when the applied electric field disappears, the dielectric polarization does not become 0 and a certain level of residual polarization exists. That is, the polarization characteristics depend on the history of the electric field (E) applied to a material having the ferroelectric property, and may have, for example, a polarization characteristic conforming to a hysteresis graph expressed as ferro. As shown in the graph, the ferroelectric property has a higher permittivity than the paraelectric property, and even when the applied electric field disappears, the ferroelectric property shows the residual polarization characteristic. In this aspect, the ferroelectric property provides the applicability to a memory device.

Meanwhile, even a material having the ferroelectric property transitions into a paraelectric property at a transition temperature defined as a Curie temperature ($T_c$) or higher, since (Ba, Sr)TiO$_3$ has the ferroelectric-paraelectric transition temperature being higher than room temperature, (Ba, Sr)TiO$_3$ may maintain the ferroelectric property well.

The out-of-plane tensile strain acting on the dielectric layer 150 may vary depending on the lattice constant of the support layer 110 and the n value of the compound, and a material that has a lattice constant providing the maximum or optimal out-of-plane strain with respect to the compound may be used for the support layer 110. The support layer 110 may include a perovskite structure compound. The lattice constant of support layer 110 may be smaller than the lattice constant of the RP phase compound which constitutes the dielectric layer 150 formed on the support layer 110.

The RP phase compound which constitutes the dielectric layer 150 may be (Sr, Ba)$_{n+1}$Ti$_n$O$_{3n+1}$. That is, the compound is obtained by using (Sr, Ba) as A, Ti as B, and O as X. The atomic arrangement and the tendency of permittivity with respect to strain may vary depending on the n value of (Sr, Ba)$_{n+1}$Ti$_n$O$_{3n+1}$ and the ratio of Sr and Ba.

Figure 4:
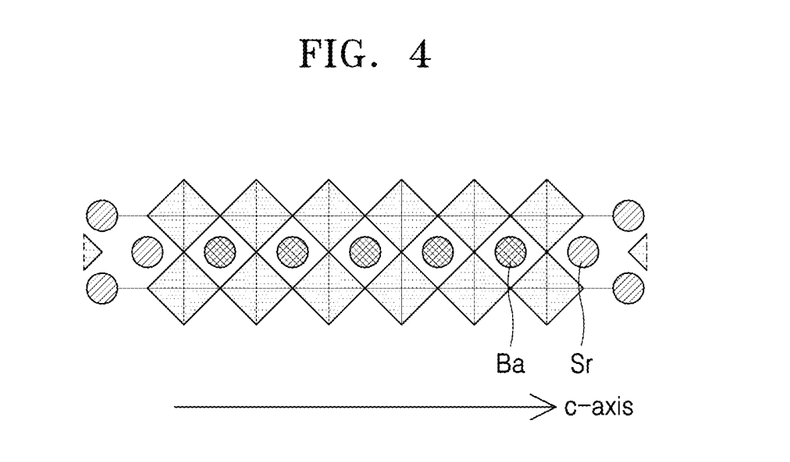
FIG. 4 shows a major part of the crystal structure of a first RP phase compound represented by $(Sr, Ba)_{n+1}Ti_nO_{3n+1}$ where n is 6.
Figure 5:
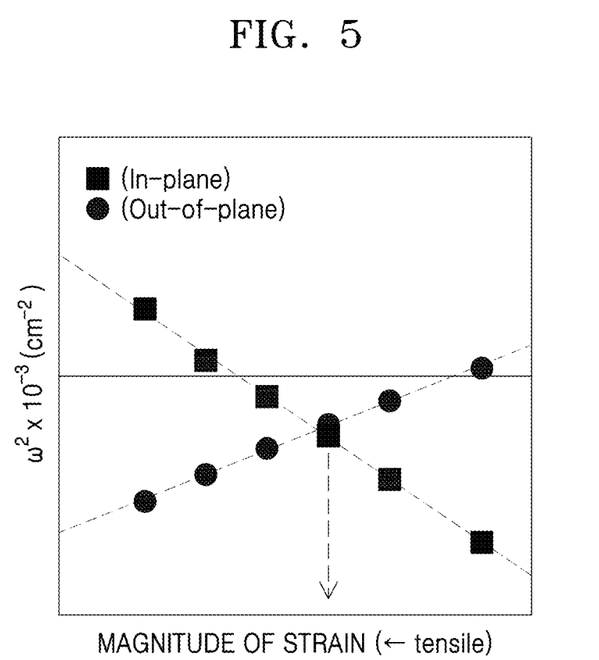
FIG. 5 shows a graph of strain vs. phonon angular frequency of the first RP phase compound of FIG. 4.

FIG. 4 shows the image of the first RP phase compound, in particular, the major portion of the crystal structure of (Sr, Ba)$_{n+1}$Ti$_n$O$_{3n+1}$ where n is 6, and FIG. 5 shows the graph of phonon angular frequency vs. strain of the compound of FIG. 4.

A unit cell of (Sr, Ba)$_{n-}$Ti$_n$O$_{3n+1}$ includes a perovskite layer represented by (Sr, Ba) TiO$_3$ and a rocksalt layer represented by (Sr, Ba)O, and FIG. 4 shows only the perovskite layer. The structure (BaTiO$_3$) in which Ba is surrounded by four octahedra is repeated five times along the c-axis, according to the ratio of Sr and Ba. This structure will be referred to as (BBBBB) for convenience.

Referring to FIG. 5, the angular frequency w of phonon in the direction of in-plane increases when the tensile strain increases, and the angular frequency of phonon in the direction of out-of-plane decreases when the tensile strain increases. The permittivity is known to increase in proportion to $\omega^{-2}$. Accordingly, since the angular frequency ($\omega$) of the phonon in the direction of out-of-plane decreases as the tensile strain in the direction of out-of-plane increases, the permittivity in the direction of out-of-plane increases.

In the graph, the spot indicated by an arrow represents the magnitude of a strain that is required when the ferroelectric polarization rotates from in-plane to out-of-plane. That is, such a magnitude of strain may induce out-of-plane polarization.

Figure 6:
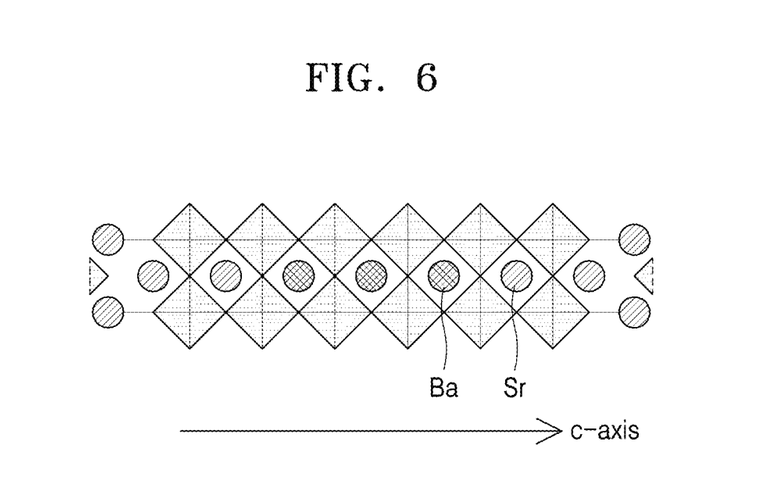
FIG. 6 shows a major part of the crystal structure of a second RP phase compound represented by $(Sr, Ba)_{n+1}Ti_nO_{3n+1}$ where n is 6.
Figure 7:
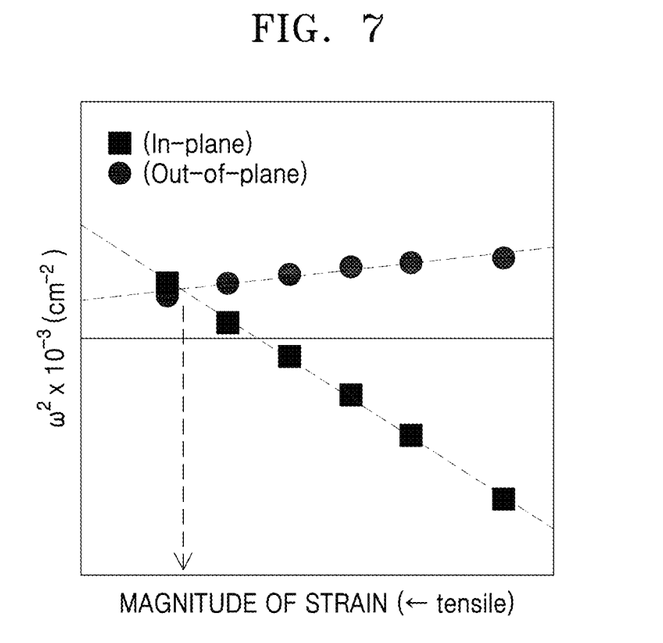
FIG. 7 shows a graph of strain vs. phonon angular frequency of the second RP phase compound of FIG. 6.

FIG. 6 shows the image of the second RP phase compound, in particular, the major portion of the crystal structure of (Sr, Ba)$_{n-}$Ti$_n$O$_{3n+1}$ where n is 6, and FIG. 7 shows the graph of phonon angular frequency vs. strain of the compound of FIG. 6.

The second RP phase compound is different from the first RP phase compound in the ratio of Sr and Ba, and has a three-layered structure of BaTiO$_3$ with SrTiO$_3$ at facing ends thereof in a c-axis direction. This structure will be referred to as (SBBBS) for convenience. Compared with the (BBBBB) structure illustrated in FIG. 4, the (SBBBS) structure has the structure of the perovskite layer of BaTiO$_3$ and the rocksalt layer with SrTiO$_3$ buffer layer therebetween.

Referring to FIG. 7, the tendency of the angular frequency of phonon with respect to tensile strain in the direction of in-plane is similar to as shown in FIG. 5, and the tendency of the angular frequency of phonon with respect to tensile strain in the direction of out-of-plane has a smaller slope than as shown in FIG. 5.

When the graph of the out-of-plane angular frequency with respect to the tensile strain of FIG. 5 is compared with the graph of the out-of-plane angular frequency with respect to the tensile strain of FIG. 7, it can be seen that, at the same magnitude of tensile strain, the structure of FIG. 4, that is, the (BBBBB) structure has higher out-of-plane permittivity. Like the graph of FIG. 5, the spot indicated as an arrow shows the magnitude of strain that is required when the ferroelectric polarization rotates from in-plane to out-of-plane. That is, such a magnitude of strain may induce out-of-plane polarization.

As the angular frequency of phonon with respect to the structures of FIGS. 4 and 6 has been described in connection with FIGS. 5 and 7, both structures all show a decrease in the angular frequency of phonon, that is, an increase in permittivity according to the increase in the tensile strain in the direction of out-of-plane. Thus, the structures are useful for the embodiment of a higher permittivity. Both structures are common in that the ratio of Sr and Ba is set to provide an atomic arrangement in which Ba is not immediately adjacent to the rocksalt layer, and also this atomic arrangement seems to act as a major factor to provide high permittivity.

Also, as described above, regarding the RP phase compound represented by (Sr, Ba)$_{n+1}$Ti$_n$O$_{3n+1}$ where n is 6, when Sr and Ba are present at such a ratio to be represented as the (BBBBB) structure, a higher permittivity may be obtained in the direction of out-of-plane, compared to when Sr and Ba are present at such a ratio to be represented as the (SBBBS) structure.

Figure 8:
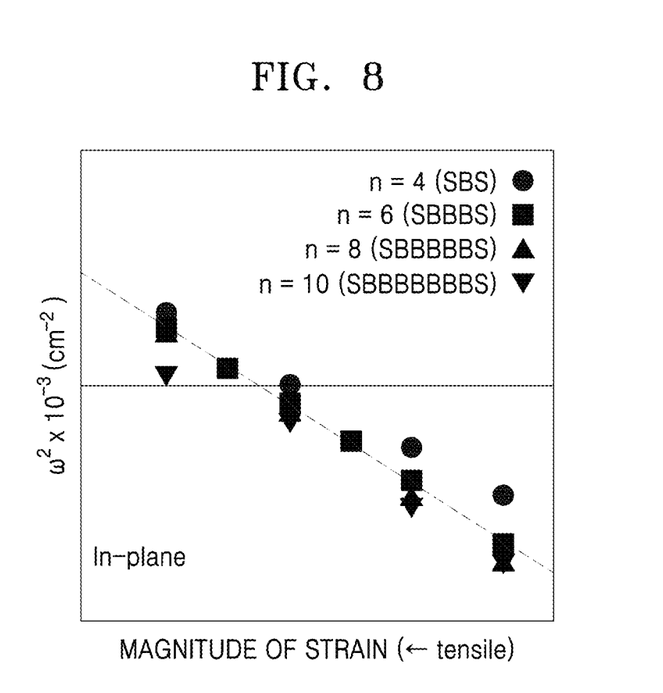
FIG. 8 shows a graph of strain vs. in-plane phonon angular frequency of various RP phase compounds having different n values and different atomic arrangements.
Figure 9:
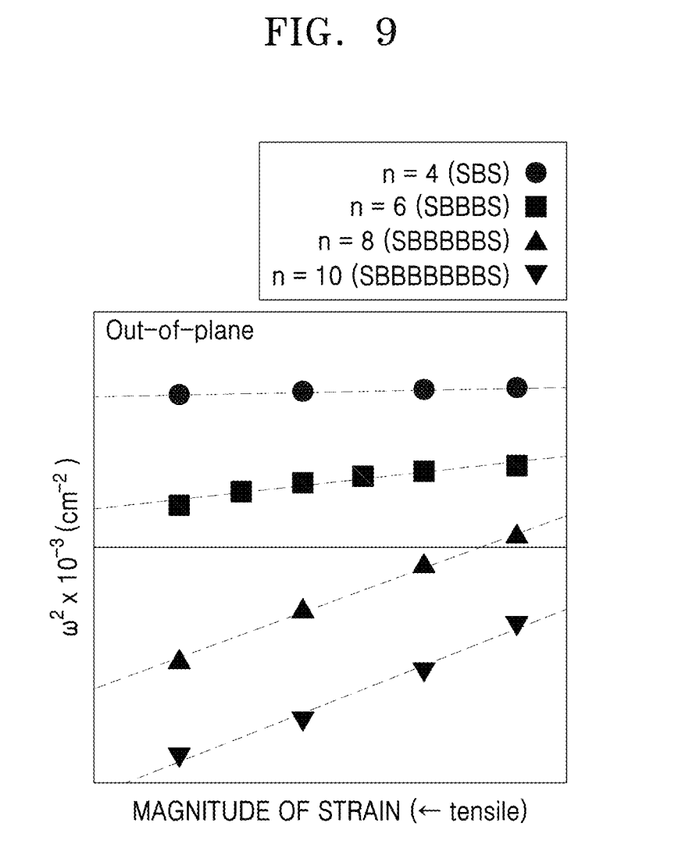
FIG. 9 shows a graph of strain vs. out-of-plane phonon angular frequency of various RP phase compounds having different n values and different atomic arrangements.

FIGS. 8 and 9 are graphs of strain-to-phonon angular frequency of the RP phase compound according to the n value and the atomic arrangement. FIG. 8 shows the graph of the phonon angular frequency with respect to strain in the direction of in-plane, and FIG. 9 shows the graph of the phonon angular frequency with respect to strain in the direction of out-of-plane.

These RP-phase compounds used herein have an atomic arrangement which includes SrTiO$_3$ for a buffer layer, like the structure of FIG. 6, and have different n values. The crystal structures corresponding to n=4 (SBS), n=6 (SBBBS), n=8 (SBBBBBS), n=10 (SBBBBBBBS) shown in the graph may be deduced with reference to the description of FIGS. 4 and 6.

Referring to the graph of FIG. 8, the tendency of angular frequency of phonon on the direction of in-plane does not significantly change according to the n value and the amount of Ba.

Referring to the graph of FIG. 9, the graph of the angular frequency of phonon in the direction of out-of-plane with respect to the tensile strain has a greater slope as the n value increases. The rate of the decrease in the angular frequency of phonon with respect to the increase in the tensile strain, that is, the rate of the increase in the rate of permittivity in the direction of out-of-plane is rapidly increased as the n value increases. When n is 4, the rate of the decrease in the angular frequency of phonon with respect to the increase in the tensile strain is small, and when n is at least 6, or at least 8, the rate of the increase of permittivity in the direction of out-of-plane is effectively increased with respect to the increase in the tensile strain. This result shows that in a crystal structure having a 5-layered BaTiO$_3$, the permittivity in the direction of out-of-plane is effectively increased.

Referring to FIGS. 4 to 9, main factors which determine the detailed structure of the RP phase compound that constitutes the dielectric layer 150 are the n value, atoms constituting the RP phase, the atomic arrangement, and a relative arrangement and proportion of a plurality of atoms, for example, Sr and Ba. By controlling these factors, a tensile strain which may effectively contribute to the increase in the permittivity in the direction of out-of-plane may be determined, and in consideration of the determined tensile strain, the materials of the support layer 110 and the dielectric layer 150 may be set.

Figure 10:
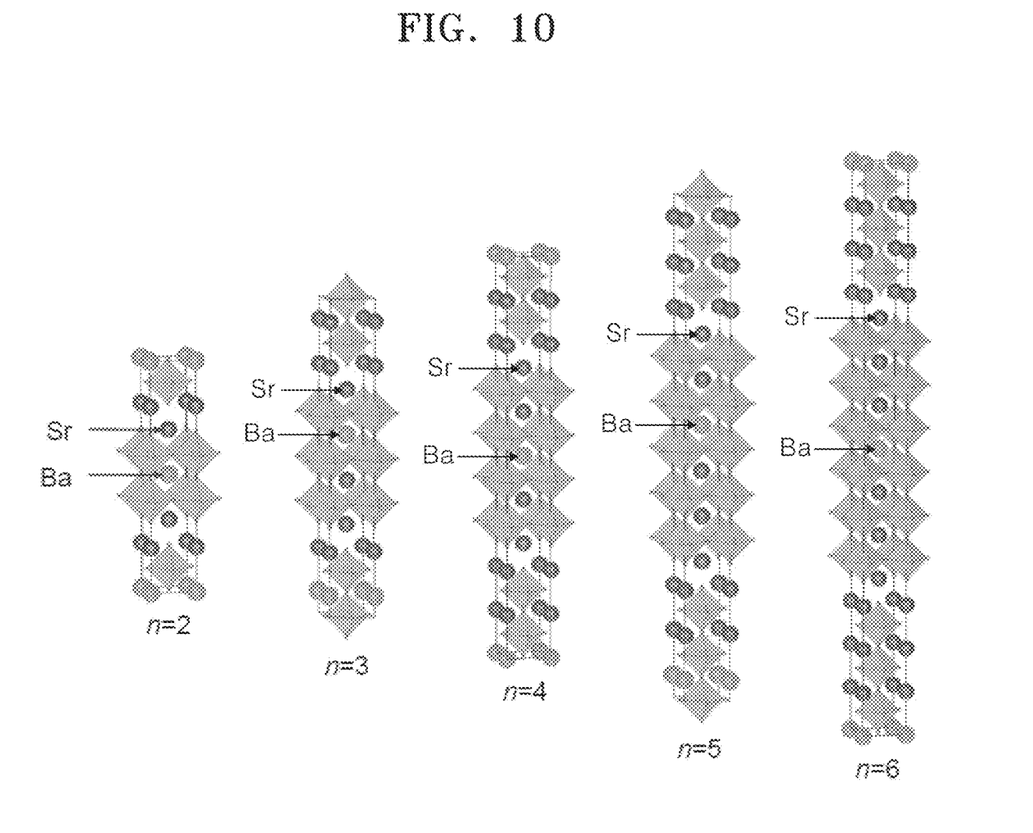
FIG. 10 shows examples of a unit cells of various RP phase compounds that can be used in a dielectric layer of FIG. 1.

FIG. 10 shows examples of a unit cell of a RP phase compound including the dielectric layer illustrated in FIG. 1.

Example structures illustrated in FIG. 10 are RP phase compounds represented by (SrTiO$_3$)$_{n-1}$(BaTiO$_3$)$_1$SrO where the ratio of Sr to Ba is n:1, and have the atomic arrangement in which Ba does not contact a SrO rocksalt layer.

As described above, by inducing the polarization in the direction of out-of-plane caused by interfacial engineering, the dielectric layer 150 may obtain high permittivity in the direction of out-of-plane. This dielectric layer 150 may be applied to various thin-film structures and electronic devices that require high permittivity, ferroelectric properties, and low leakage current at small thickness.

Figure 11:
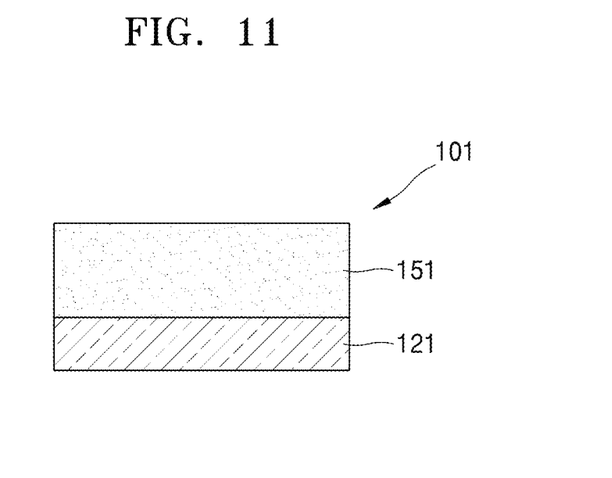
FIG. 11 shows a cross-sectional view showing a schematic structure of a thin-film structure according to an embodiment.

FIG. 11 shows a cross-sectional view showing a schematic structure of a thin-film structure 101 according to an embodiment.

The thin-film structure 101 includes a lower electrode layer 121 and a dielectric layer 151. The lattice constant of lower electrode layer 121 may be smaller than the lattice constant of the dielectric layer 151. The lower electrode layer 121 may include a conductive compound.

Like the dielectric layer 150 of the thin-film structure 100 of FIG. 1, the dielectric layer 151 may include a compound of which tensile strain in the direction of out-of-plane is induced by compressive strain in the direction of in-plane due to the lattice constant relationship with the lower electrode layer 121.

The dielectric layer 151 may include a compound having a Ruddlesden-Popper phase(A$_{n+1}$B$_n$X$_{3n+1}$) (A and B are each a cation, X is an anion, and n is a natural number) (hereinafter referred to as 'RP phase'). A may be an alkali metal, an alkaline earth metal, or a rare earth metal, and B may be a transition metal. The RP phase compound which constitutes the dielectric layer 150 may be (Sr, Ba)$_{n+1}$Ti$_n$O$_{3n+1}$. That is, the compound is obtained by using (Sr, Ba) as A, Ti as B, and O as X. The n value of (Sr, Ba)$_{n+1}$Ti$_n$O$_{3n+1}$, and the ratio of Sr and Ba Sr and a relative atomic arrangement thereof, may be, as described above, controlled to effectively obtain an increase in permittivity in the direction of out-of-plane according to the increase in the tensile strain in the direction of out-of-plane.

For example, as described above, the unit cell of (Sr, Ba)$_{n+1}$Ti$_n$O$_{3n+1}$ may include an atomic arrangement which includes the perovskite layer represented by (Sr, Ba)TiO$_3$ and the rocksalt layer represented by (Sr, Ba)O, wherein Ba does not directly contact the SrO rocksalt layer. This structure can be expressed by the structure of (BB . . . , BB) or (SB . . . , BS), and the repeat number of BaTiO$_3$ repeatedly arranged along the crystal axis (c axis) direction may be 5 or more. The compound may be represented by (SrTiO$_3$)$_{n-1}$(BaTiO$_3$)SrO.

The lower electrode layer 121 may include a conductive compound having a perovskite structure. The lower electrode layer 121 may have the chemical formula of, for example, ABO$_3$, wherein A may be Sr, Ba, or Ca and B may be Ru, Ti, Ta, or Nb. The lower electrode layer 121 may be represented by SrRuO$_3$, but is not limited thereto. Due to such a structure, an effective compressive strain in the direction of in-plane and resulting tensile strain in the direction of out-of-plane may be induced in relation to the RP-phase compound placed on the lower electrode layer 121.

Figure 12:
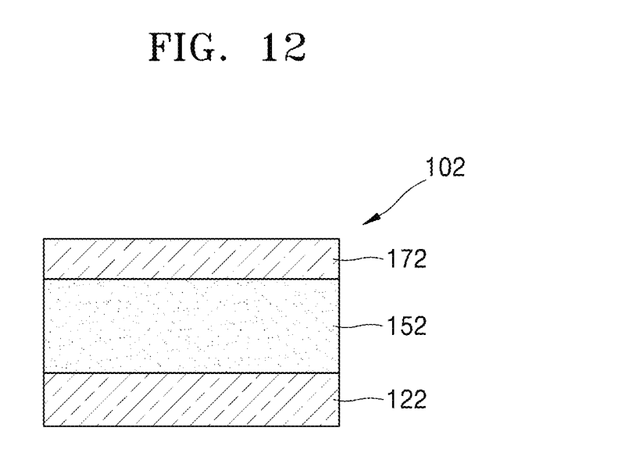
FIG. 12 shows a cross-sectional view showing a schematic structure of a thin-film structure according to an embodiment.

FIG. 12 shows a cross-sectional view showing a schematic structure of a thin-film structure 102 according to an embodiment.

The thin-film structure 102 includes a lower electrode layer 122, a dielectric layer 152, and an upper electrode layer 172. Unlike the thin-film structure 101, the thin-film structure 102 further includes the upper electrode layer 172, and the lower electrode layer 122 and the dielectric layer 152 are substantially the same as the lower electrode layer 121 and the dielectric layer 151 of FIG. 11. The upper electrode layer 172 may include a conductive material which is not particularly limited. The material for the upper electrode layer 172 may be the same as or different from that of the lower electrode layer 122. The thin-film structure 102 may function as a capacitor or a memory element. The dielectric layer 152 may have high permittivity in the direction of out-of-plane, and has the hysteresis property as described in FIG. 3. Due to these properties, the dielectric layer 152 can function as a capacitor or a memory device manufactured in small sizes and have high performance.

Figure 13:
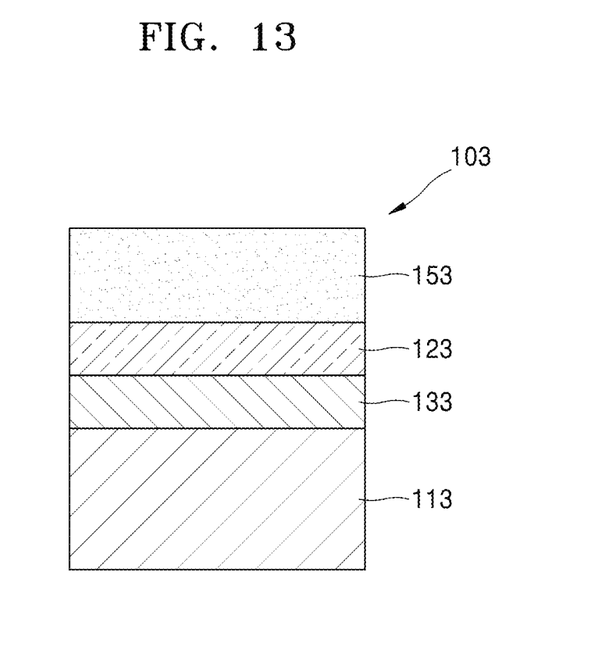
FIG. 13 shows a cross-sectional view showing a schematic structure of a thin-film structure according to an embodiment.

FIG. 13 shows a cross-sectional view showing a schematic structure of a thin-film structure 103 according to an embodiment;

The thin-film structure 103 may include a silicon substrate 113, a buffer layer 133, a lower electrode layer 123, and a dielectric layer 153. The thin-film structure 103 according to the present embodiment differs from the thin-film structure 102 of FIG. 12 in that the silicon substrate 113 and the buffer layer 133 are further provided. The lower electrode layer 123 and the dielectric layer 153 may be substantially the same as the lower electrode layer 122 and the dielectric layer 152 of the thin-film structure 102 of FIG. 12.

The buffer layer 133 may be provided to buffer defects due to lattice mismatch between the silicon substrate 113 and the lower electrode layer 123. Like the lower electrode layer 123, the buffer layer 133 may have the perovskite structure. The buffer layer 133 may include SrTiO$_3$, but the material therefor is not limited thereto.

Figure 14:
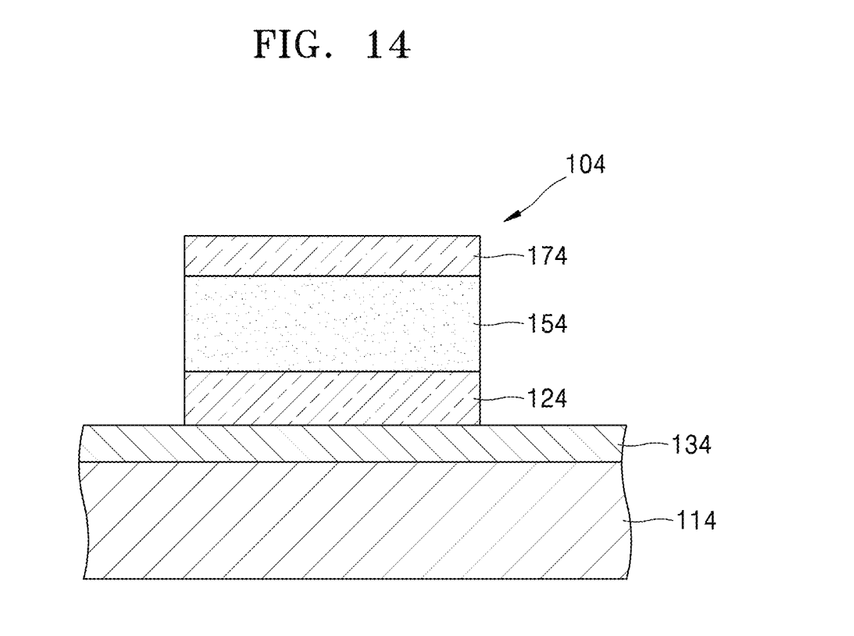
FIG. 14 shows a cross-sectional view showing a schematic structure of an integrated device according to an embodiment.

FIG. 14 is a cross-sectional view showing a schematic structure of an integrated device 104 according to an embodiment.

The integrated device 104 includes a silicon substrate 114, a buffer layer 134, a lower electrode layer 124, a dielectric layer 154, and an upper electrode layer 174.

The integrated device 104 may be part of an integrated circuit which includes a silicon substrate 114 as a basis. Such an integrated circuit may include a plurality of capacitors, transistors, memory devices, and the like, and these devices may embody high performance and miniaturization by including the dielectric layer 154 having a high permittivity. The integrated device 104 may include many electronic devices which are manufactured based on a template in which the buffer layer 134 is formed on the silicon substrate 114. Embodiments are not limited to the illustrated structure.

While FIGS. 13-14 illustrate non-limiting examples where the substrates 113 and 114 are silicon substrate, the substrates 113 and 114 in other embodiments may be other semiconductor materials.

Figure 15:
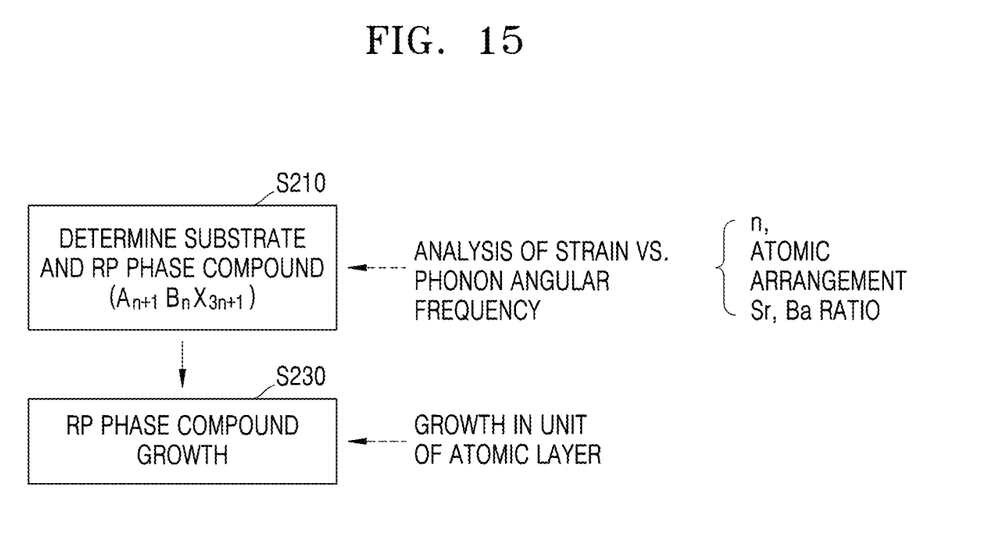
FIG. 15 shows a schematic flowchart for explaining a method of manufacturing a thin-film structure according to the embodiment.

FIG. 15 is a schematic flowchart illustrating a method of manufacturing a thin-film structure according to an embodiment.

The method of manufacturing the thin-film structure, as described above, aims at forming a dielectric layer that obtains high permittivity by inducing a tensile strain in the direction of out-of-plane from the compressive strain in the direction of in-plane acting on the interface of the dielectric layer.

The method of manufacturing the thin-film structure includes determining a substrate and a RP phase compound to be formed on the substrate ($A_{n+1}B_nX_{3n+1}$) (A and B are each a cation, X is anion, and n is a natural number)(S210) and growing the RP phase compound on the substrate (S230).

When the substrate and RP phase compound are determined, the strain acting on the compound versus phonon angular frequency can be analyzed. Details of the RP phase compound may be determined to effectively embody high permittivity based on the analysis of the angular frequency tendency of in-plane motion and out-of-plane motion of phonon. At this time, not only A, B, and X, but also n value, atomic arrangement, and the ratio of a plurality of atoms used as A, for example, the ratio of Sr and Ba may be considered as main factors. In addition, substrates with lattice constants suitable for the target tensile strain may be selected. The substrate may be an electrode layer including a conductive compound.

When the RP phase compound is grown (S230), a growth method in which the crystallinity of the RP phase compound is maintained may be used. For example, a growth method in which a plurality of atomic layers constituting the compound may be sequentially grown in the unit of atomic layer, and the growth method may be chemical vapor deposition (CVD), molecular beam epitaxy (MBE), or pulsed laser deposition (PLD).

The above-described thin-film structure and the method of manufacturing the same may embody a dielectric material having high permittivity through interfacial engineering which induces out-of-plane polarization.

The thin-film structure described above can be applied to an electronic device such as a capacitor, a memory device, or the like, and to various integrated devices for an integrated circuit including a silicon substrate as a basis.

It should be understood that example embodiments described herein should be considered in a descriptive sense only and not for purposes of limitation. While some example embodiments have been particularly shown and described, it will be understood by one of ordinary skill in the art that variations in form and detail may be made therein without departing from the spirit and scope of the claims.

What is claimed is:

1. A thin-film structure comprising:
a support layer including a material having a lattice constant; and
a dielectric layer on the support layer,
the dielectric layer including a compound having a Ruddlesden-Popper phase ($A_{n+1}B_nX_{3n+1}$), where A and B each independently include a cation, X is an anion, and n is a natural number, the lattice constant of the material of the support layer being less than a lattice constant of the compound, wherein
A includes strontium (Sr) and barium (Ba) at a ratio to each other,
the compound is represented by $(Sr, Ba)_{n+1}Ti_nO_{3n+1}$,
a unit cell of the compound includes a perovskite layer represented by $(Sr, Ba)TiO_3$ and a rocksalt layer represented by SrO, and
a ratio of Sr and Ba is determined such that Ba is not adjacent to the rocksalt layer.

2. The thin-film structure of claim 1, wherein
a compressive strain occurs in the dielectric layer at an interface between the dielectric layer and the supporting layer,
the compressive strain in the dielectric layer occurs in an in-plane direction that is in-plane with the interface between the dielectric layer and the supporting layer,
the compressive strain in the dielectric layer induces a tensile strain in the dielectric layer, and
the tensile strain occurs in an out-of-plane direction that is out-of-plane with the interface between the dielectric layer and the supporting layer.

3. The thin-film structure of claim 2, wherein
the tensile strain in the dielectric layer that occurs in the out-of-plane direction varies with the n value of the compound and the lattice constant of the material of the support layer.

4. The thin-film structure of claim 3, wherein
the lattice constant of the material included in the support layer is capable of maximizing the tensile strain in the dielectric layer that occurs in the out-of-plane direction with respect to the compound.

5. The thin-film structure of claim 1, wherein
the material included in the support layer has a perovskite structure.

6. A thin-film structure comprising:
a lower electrode layer including a conductive compound having a perovskite structure and a lattice constant; and
a dielectric layer on the lower electrode layer,
the dielectric layer including a compound with a lattice constant that is greater than the lattice constant of the conductive compound,
the compound having a Ruddlesden-Popper phase ($A_{n+1}B_nX_{3n+1}$), where A and B each independently include a cation, X is an anion, and n is a natural number, wherein
A includes strontium (Sr) and barium (Ba) at a ratio to each other,
the compound is represented by $(Sr, Ba)_{n+1}Ti_nO_{3n+1}$,
a unit cell of the compound includes a perovskite layer represented by $(Sr, Ba)TiO_3$ and a rocksalt layer represented by SrO, and
a ratio of Sr and Ba is determined such that Ba is not adjacent to the rocksalt layer.

7. The thin-film structure of claim 6, wherein
a compressive strain occurs in the dielectric layer at an interface between the dielectric layer and the lower electrode layer,
the compressive strain in the dielectric layer occurs in an in-plane direction that is in-plane with the interface between the dielectric layer and the lower electrode layer, the compressive strain in the dielectric layer induces a tensile strain in the dielectric layer, and the tensile strain occurs in an out-of-plane direction that is out-of-plane with the interface between the dielectric layer and the lower electrode layer.

8. The thin-film structure of claim 7, wherein
the tensile strain in the dielectric layer that occurs in the out-of-plane direction varies with the n value of the compound and the lattice constant of the conductive compound in the lower electrode layer.

9. The thin-film structure of claim 6, further comprising a silicon substrate; and
a buffer layer on the silicon substrate, wherein
the buffer layer, the lower electrode layer, and the dielectric layer are sequentially located on the silicon substrate.

10. The thin-film structure of claim 9, wherein
the buffer layer includes a material having a perovskite structure.

11. The thin-film structure of claim 9, wherein
the lower electrode layer includes $SrRuO_3$, and
the buffer layer includes $SrTiO_3$.

12. An integrated device comprising:
the thin-film structure according to claim 6, and
an upper electrode layer on the thin-film structure to face the lower electrode layer with the dielectric layer therebetween.

13. A thin-film structure comprising:
a support layer including a material having a lattice constant; and
a dielectric layer on the support layer,
the dielectric layer including a compound having a lattice constant that is greater than the lattice constant of the material in the support layer such that compressive strain occurs in the dielectric layer in an in-plane direction that is in-plane with an interface between the dielectric layer and the support layer,
the compound of the dielectric layer having a Ruddlesden-Popper phase $(A_{n+1}B_nX_{3n+1})$, where
A includes two or more elements selected from the group consisting of alkali metals, alkaline earth metals, and rare earth metals,
B is a transition metal,
X is an anion, and
n is a natural number, wherein
A includes strontium (Sr) and barium (Ba) at a ratio to each other,
the compound is represented by $(Sr, Ba)_{n+1}Ti_nO_{3n+1}$,
a unit cell of the compound includes a perovskite layer represented by $(Sr, Ba)TiO_3$ and a rocksalt layer represented by SrO, and
a ratio of Sr and Ba is determined such that Ba is not adjacent to the rocksalt layer.

14. A capacitor comprising:
the thin-film structure of claim 13; and
an upper electrode on the dielectric layer, wherein
the support layer includes a lower electrode layer.

15. An electronic device comprising:
the capacitor of claim 14.

16. A method of manufacturing a thin-film structure, the method comprising:
forming a dielectric layer on a substrate,
the substrate including a material having a lattice constant,
the dielectric layer including a compound having a Ruddlesden-Popper phase $(A_{n+1}B_nX_{3n+1})$, where A and B each independently include a cation, X is an anion, and n is a natural number, and
the lattice constant of the material of the substrate is less than a lattice constant of the compound of the dielectric layer, wherein
A includes strontium (Sr) and barium (Ba) at a ratio to each other,
the compound is represented by $(Sr, Ba)_{n+1}Ti_nO_{3n+1}$,
a unit cell of the compound includes a perovskite layer represented by $(Sr, Ba)TiO_3$ and a rocksalt layer represented by SrO, and
a ratio of Sr and Ba is determined such that Ba is not adjacent to the rocksalt layer.

17. The method of claim 16, wherein
the forming the dielectric layer includes determining A, B, X, and n based on
analyzing a trend of an angular frequency of an in-plane motion and an out-of-plane motion of phonons according to a strain in a direction of the out-of-plane at an interface between the substrate and the dielectric layer.

18. The method of claim 16, wherein
the forming the dielectric layer on the substrate includes growing the dielectric layer using a growth method that maintains a crystallinity of the compound of the dielectric layer.

19. The method of claim 18, wherein
the forming the dielectric layer includes growing
a plurality of atomic layers constituting the compound in units of atomic layers.

20. The method of claim 18, wherein
the forming the dielectric layer is performed using chemical vapor deposition (CVD), molecular beam epitaxy (MBE), or pulsed laser deposition (PLD).

* * * * *